United States Patent [19]

Ecker et al.

[11] Patent Number: 6,037,642
[45] Date of Patent: Mar. 14, 2000

[54] RADIATION SENSITIVE TRANSDUCER WHEREIN DEFORMATION DUE TO TEMPERATURE FLUCTUATIONS IS AVOIDED

[75] Inventors: Klaus Ecker, Regensburg; Hartmut Sklebitz, Erlangen, both of Germany

[73] Assignee: Siemens Aktiengesellschaft, Munich, Germany

[21] Appl. No.: 09/094,072

[22] Filed: Jun. 9, 1998

[51] Int. Cl.⁷ .................... H01L 31/0203; H01L 31/00
[52] U.S. Cl. .................... 257/433; 257/99; 257/466; 438/64
[58] Field of Search .................... 257/99, 294, 433, 257/435, 458, 466; 438/48, 64

[56] References Cited

U.S. PATENT DOCUMENTS 4,775,895  10/1988  Traupe et al. .
4,810,881   3/1989  Berger et al. .
5,298,742   3/1994  Friauf et al. .

FOREIGN PATENT DOCUMENTS

WO 94/17557  8/1994  WIPO .

OTHER PUBLICATIONS

"Silicon Detector System for High Rate EXAFS Applications," Pullia et al., IEEE Trans. On Nucl. Sci., vol. 42, No. 4, Aug. 1995, pp. 585–586.

*Primary Examiner*—Mahshid Saadat
*Assistant Examiner*—Allan R. Wilson
*Attorney, Agent, or Firm*—Hill & Simpson

[57] ABSTRACT

A radiation-sensitive transducer with a doped semiconductor sensor is to be constructed on a mounting plate such that it does not deform during temperature fluctuations. On the back side of the mounting plate, i.e., the side opposite the side on which the semiconductor sensor is mounted, an additional element having the same dimensions as the semiconductor sensor is attached opposite the semiconductor sensor. The additional element is composed of the same semiconductor material as of the semiconductor sensor, but is undoped. Due to the corresponding size and material of the semiconductor sensor and the additional element, they respectively produce equal but opposite forces acting on the mounting plate during temperature fluctuations, so no deformation occurs.

4 Claims, 1 Drawing Sheet

RADIATION SENSITIVE TRANSDUCER WHEREIN DEFORMATION DUE TO TEMPERATURE FLUCTUATIONS IS AVOIDED

BACKGROUND OF THE INVENTION

1. Field of the Invention

The present invention is directed to a radiation-sensitive transducer, and in particular to a radiation-sensitive transducer of the type which converts light incident thereon into an electrical signal.

2. Description of the Prior Art

Monocrystalline light-sensitive sensors (e.g. CCDs or photodiode arrays) must often be constructed with large surfaces and fastened to a mounting plate. The electrical connection of the sensor and the mechanical fastening in the system can ensue by means of the mounting plate. For this purpose, the sensor is usually fixedly connected to the mounting plate (e.g. glued). Upon variations in temperature, the surface of the sensor forms a curve (in a one-dimensional sensor) or a spherical surface (in a two-dimensional sensor). This can make coupling to an optical (e.g. fiber optic) system or to an image converter (e.g. scintillator) more difficult, and can lead to a loss of light, or a sensitivity or MTF loss, in regions where an enlarged coupling gap exists.

SUMMARY OF THE INVENTION

An object of the present invention is to provide a radiation-sensitive transducer with a semiconductor sensor, which is fastened on a mounting plate, and constructed such that the above-described deformation during temperature fluctuations is avoided.

The above object is achieved in accordance with the principles of the present invention in a radiation-sensitive transducer including a radiation-sensitive sensor, composed of doped semiconductor material, which is attached to a mounting plate, the transducer also including an additional element, mounted on a side of the mounting plate opposite said radiation-sensitive sensor, the additional element being composed of the same semiconductor material (but undoped) and having substantially the same shape as the radiation-sensitive sensor.

Due to the corresponding position, size and material of the semiconductor sensor and the additional element, they respectively produce equal but opposite forces acting on the mounting plate during temperature fluctuations. These forces substantially cancel each other, so that no deformation of the overall transducer occurs.

DESCRIPTION OF THE PREFERRED EMBODIMENTS

Figure 1:
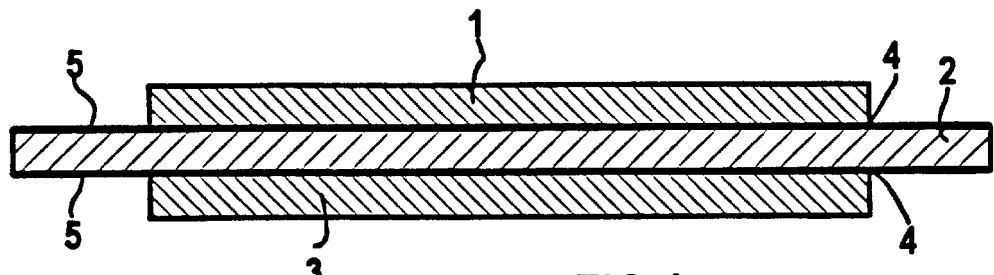
FIG. 1 is a side sectional view of a transducer according to the invention.
Figure 2A:
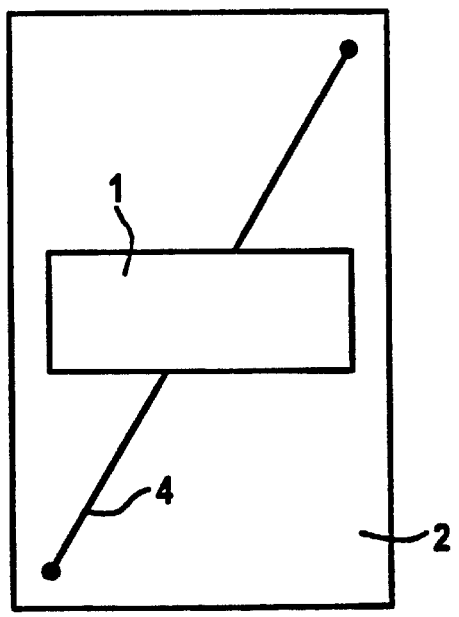
FIGS. 2a and 2b are views of a transducer according to the invention from above and below, in a representation that is smaller in relation to FIG. 1.
Figure 2B:
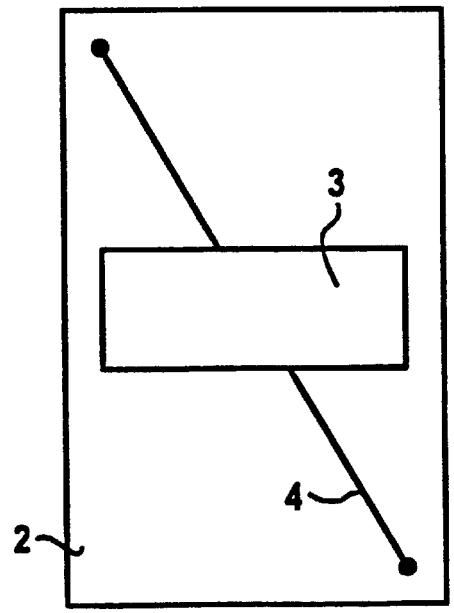

FIGS. 1, 2a and 2b show a semiconductor sensor 1, attached to a mounting plate 2. The semiconductor sensor 1 is composed of doped semiconductor material. The mounting plate 2 can be e.g., plastic, glass-reinforced epoxy resin, metal or ceramic material. In addition to the semiconductor sensor 1, on the back side of the mounting plate 2, i.e., the side opposite the semiconductor sensor 1, in the opposite position, an equally large, approximately equally thick additional element 3, of the same semiconductor material and the same or approximately the same dimensions as the semiconductor sensor 1 is arranged and is connected with the mounting plate 2 with the same fastening materials, e.g. with the same glue. The additional element 3 is not doped, since this would be an unnecessary added cost and since the additional element 3 is provided only for force compensation, it is not a functioning sensor. Moreover, although the term "element" is used to describe the additional element 3, it need not be a discrete element phase, but it is only necessary that it be an aggregation of the same semiconductor material as the sensor 1 having the same dimensions as the sensor 1.

The resulting sandwich arrangement makes deformation during temperature changes impossible, since pressure or tension forces exerted by the semiconductor sensor 1 on the mounting plate 2 are compensated by exactly equal forces produced by the additional element 3 from the back side of the mounting plate 2.

The temperature range in which the sandwich maintains its planar shape is limited only by the resistance to breaking of the components of the sandwich and the thermal properties of the fastening means (e.g. glue).

FIGS. 2a and 2b show that conductor strips 4, and possibly insulating layers 5 (FIG. 1), are attached symmetrically, as far as possible, on both sides of the mounting plate 2.

Although modifications and changes may be suggested by those skilled in the art, it is the intention of the inventors to embody within the patent warranted hereon all changes and modifications as reasonably and properly come within the scope of their contribution to the art.

We claim as our invention:

1. A radiation-sensitive transducer comprising:
   a mounting plate having first and second opposite sides;
   a radiation-sensitive sensor attached to said first side of said mounting plate,
      said radiation-sensitive sensor having a size and shape and being
      comprised of semiconductor material with a dopant; and an additional element mounted on said second side of said mounting plate
      having the same size and shape as said radiation-sensitive sensor and
      being comprised of said semiconductor material, without any dopant.

2. A transducer as claimed in claim 1 further comprising mounting material attaching said radiation-sensitive sensor to said first side of said mounting plate, and said additional element being attached to said second side of said mounting plate by mounting material which is the same as said mounting material attaching said radiation-sensitive sensor to said mounting plate.

3. A transducer as claimed in claim 1 further comprising at least one first conductor strip and at least one second conductor strip respectively disposed on said first and second sides of said mounting plate symmetrically relative to each other.

4. A transducer as claimed in claim 1 further comprising at least one first insulating layer and at least one second insulating layer respectively disposed on said first and second sides of said mounting plate symmetrically relative to each other.

* * * * *